United States Patent

Feldhaus et al.

(10) Patent No.: US 11,387,922 B2
(45) Date of Patent: Jul. 12, 2022

(54) RECEIVER WITH A POWER DETECTING FUNCTION FOR A PULSED SIGNAL AND RECEIVING METHOD

(71) Applicant: Rohde & Schwarz GmbH & Co. KG, Munich (DE)

(72) Inventors: Gregor Feldhaus, Munich (DE); Matthias Ruengeler, Markt Schwaben (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 199 days.

(21) Appl. No.: 16/800,275

(22) Filed: Feb. 25, 2020

(65) Prior Publication Data

US 2021/0266081 A1 Aug. 26, 2021

(51) Int. Cl.
*H04B 17/20* (2015.01)
*G01R 21/133* (2006.01)
*H04B 1/16* (2006.01)

(52) U.S. Cl.
CPC .......... *H04B 17/20* (2015.01); *G01R 21/133* (2013.01); *H04B 1/16* (2013.01)

(58) Field of Classification Search
CPC ......... G01R 21/133; H04B 17/20; H04B 1/16
See application file for complete search history.

(56) References Cited

U.S. PATENT DOCUMENTS

| | | | |
|---|---|---|---|
| 3,873,918 A | 3/1975 | Talbert | |
| 4,121,164 A | 10/1978 | Feucht | |
| 4,564,804 A | 1/1986 | Wilke et al. | |
| 5,212,485 A | 5/1993 | Shank et al. | |
| 5,343,405 A | 8/1994 | Kucera et al. | |
| 5,706,202 A | 1/1998 | Itahara et al. | |
| 5,982,308 A | 11/1999 | Bang | |
| 6,191,571 B1 | 2/2001 | Fukui et al. | |
| 2003/0198304 A1* | 10/2003 | Sugar | G01R 13/0254 375/340 |
| 2012/0230369 A1* | 9/2012 | Zhang | H04B 1/71632 375/130 |

FOREIGN PATENT DOCUMENTS

| | | | |
|---|---|---|---|
| EP | 0313020 A2 | 4/1989 | |
| EP | 0448322 A2 | 9/1991 | |
| EP | 0555491 A1 | 8/1993 | |

\* cited by examiner

*Primary Examiner* — Rahel Guarino
(74) *Attorney, Agent, or Firm* — Potomac Technology Law, LLC (57) ABSTRACT

A receiver with a power detecting function for a pulsed signal is provided. Said receiver comprises an accumulator for accumulating samples of the respective power of the corresponding signal over time. In this context, the respective accumulation length is a window being based on the pulse length of the corresponding signal. Furthermore, the receiver may additionally comprise an output for outputting several windows and a maximum detector. In this context, the maximum detector is configured to determine a maximum power value of the several windows.

16 Claims, 7 Drawing Sheets

RECEIVER WITH A POWER DETECTING FUNCTION FOR A PULSED SIGNAL AND RECEIVING METHOD

TECHNICAL FIELD

The invention relates to a receiver with a power detecting function for a pulsed signal and a receiving method with a power detecting function for a pulsed signal.

BACKGROUND

Generally, in times of an increasing number of measurement applications exemplarily employing signal analyzers, there is a growing need of a receiver with a power detecting function for a pulsed signal and a receiving method with a power detecting function for a pulsed signal in order to setup said analyzers in a highly accurate and efficient manner with special respect to pulsed signals.

For instance, U.S. Pat. No. 5,343,405 A relates to an automatic extraction of pulse parametrics from multi-valued functions, such as a digital serial communications signal, which is achieved by building up an eye pattern data array from multiple acquisitions of the multi-valued functions. One axis of the data array represents amplitude and another represents time, and the contents of each element of the array represents the number of times a data point occurs within the amplitude-time interval represented by the element during the multiple acquisitions. After the data array has been built, histograms representing summations of selected elements of the data array are obtained. From the histogram information the pulse parametrics are determined, such as amplitude levels for the various states of the signal as well as the characteristics of transition paths between states. Disadvantageously, said automatic extraction does not allow for detecting power with respect to a pulsed signal in a highly accurate and efficient manner.

Accordingly, there is a need to provide a receiver with a power detecting function for a pulsed signal and a receiving method with a power detecting function for a pulsed signal, whereby both a high accuracy and a high efficiency are ensured especially in the context of setting up signal analyzers with special respect to pulsed signals.

SUMMARY

Embodiments of the present invention advantageously address the foregoing requirements and needs, as well as others, by providing a receiver with a power detecting function for a pulsed signal and a receiving method with a power detecting function for a pulsed signal, whereby both a high accuracy and a high efficiency are ensured especially in the context of setting up signal analyzers with special respect to pulsed signals.

According to a first aspect of the invention, a receiver with a power detecting function for a pulsed signal is provided. Said receiver comprises an accumulator for accumulating samples of the respective power of the corresponding signal over time. In this context, the respective accumulation length is a window being based on the pulse length of the corresponding signal.

Advantageously, if pulses are of different or unknown lengths, the minimum expected pulse length may preferably be used. Further advantageously, this input of the pulse length can come from the respective standard for the corresponding signal or may be a respective user input. As a further advantage, the window may preferably be less than or equal to the pulse length. In some special cases, the window may especially be a half of the pulse length. With respect to the above-mentioned minimum pulse length, said minimum pulse length can be pulse statistics or user input of the minimum pulse length known.

According to a first preferred implementation form of the first aspect of the invention, the receiver further comprises an output for outputting several power values, averaged or accumulated over a window, and a maximum detector. In this context, the maximum detector is configured to determine the maximum of said power values. Advantageously, for instance, both accuracy and efficiency can further be increased.

According to a second preferred implementation form of the first aspect of the invention, the maximum power value over the several windows comprises or is the respective detected power of the corresponding pulse when it is in on-state. Advantageously, for example, inaccuracies can further be reduced.

According to a further preferred implementation form of the first aspect of the invention, the receiver further comprises a control. In this context, the control is configured to instruct the maximum detector when to start or reset. Advantageously, for instance, efficiency can further be increased.

According to a further preferred implementation form of the first aspect of the invention, the receiver further comprises an attenuator comprising an input. In this context, the input is configured to receive a respective pulse power especially for setting to auto-level. Advantageously, for example, inefficiencies can further be reduced.

According to a further preferred implementation form of the first aspect of the invention, the receiver further comprises a minimum power detector. In this context, the minimum power detector is configured to provide the respective level of the corresponding signal when it is in off-state. Advantageously, for instance, accuracy can further be increased.

According to a further preferred implementation form of the first aspect of the invention, the receiver or the minimum power detector is configured to use the respective level and/or corresponding powers as an input in order to provide a trigger level. Advantageously, for example, complexity can be reduced, which leads to an increased efficiency.

According to a further preferred implementation form of the first aspect of the invention, the minimum power detector comprises a variable window length. Advantageously, for instance, flexibility can be increased, thereby also increasing efficiency.

Further advantageously, the variable window length can be based on a respective pulse repetition rate and/or a respective on-power length. As a further advantage, a respective off-power length can easily be calculated.

According to a further preferred implementation form of the first aspect of the invention, the minimum power detector is further configured to provide a respective noise level of the corresponding signal. Advantageously, for example, inefficiencies can further be reduced.

According to a further preferred implementation form of the first aspect of the invention, the receiver comprises several parallel accumulators with different time delay. In this context, the maximum detector is configured to receive respective overlapping results from the corresponding time delay especially for determining the respective power of the corresponding on-signal.

Advantageously, the window size can be increased to a greater percentage of the minimum pulse width without missing a part of the pulse.

According to a further preferred implementation form of the first aspect of the invention, the accumulator comprises or is a filter. In this context, an output of the filter comprises or is a sliding window provided to the maximum detector. Advantageously, for instance, accuracy can be increased.

According to a further preferred implementation form of the first aspect of the invention, the filter comprises or is a finite impulse response filter or an infinite impulse response filter. Advantageously, for example, complexity can be reduced, thereby increasing efficiency.

According to a further preferred implementation form of the first aspect of the invention, the filter comprises or is an accumulator followed by a decimator followed by a differentiator. Alternatively, it is noted that the filter may especially comprise or be an accumulator, a decimator, a differentiator, or any combination thereof.

Advantageously, said differentiator may preferably be a wrapping differentiator. Further advantageously, said accumulator may preferably be a wrapping accumulator. As a further advantage, wrapping is used especially in the case of limited word length.

According to a further preferred implementation form of the first aspect of the invention, the receiver further comprises a pre-processor for pre-processing especially the pulsed signal. Advantageously, for instance, inaccuracies can further be reduced.

According to a further preferred implementation form of the first aspect of the invention, the pre-processor comprises a block accumulator and/or a down-sampler to reduce a respective sampling rate. Advantageously, the respective sampling rate may preferably be reduced to a sampling rate that is to be handled by the corresponding power detection system.

According to a second aspect of the invention, a receiving method with a power detecting function for a pulsed signal is provided. Said receiving method comprises the step of accumulating samples of the respective power of the corresponding signal over time. In this context, the respective accumulation length is a window being based on the pulse length of the corresponding signal.

Advantageously, if pulses are of different lengths, the minimum pulse length may preferably be used. Further advantageously, this input of the pulse length can come from the respective standard for the corresponding signal or may be a respective user input. As a further advantage, the window may preferably be less than or equal to the pulse length. In some special cases, the window may especially be a half of the pulse length. With respect to the abovementioned minimum pulse length, said minimum pulse length can be pulse statistics or user input of the minimum pulse length known.

According to a first preferred implementation form of the second aspect of the invention, the receiving method further comprises the steps of outputting several windows, and determining a maximum power value of the several windows with the aid of a maximum detector. Advantageously, for instance, both accuracy and efficiency can further be increased.

According to a second preferred implementation form of the second aspect of the invention, the maximum power value over the several windows comprises or is the respective detected power of the corresponding pulse when it is in on-state. Advantageously, for example, inaccuracies can further be reduced.

According to a further preferred implementation form of the second aspect of the invention, the receiving method further comprises the step of instructing the maximum detector when to start or reset. Advantageously, for instance, efficiency can further be increased.

According to a further preferred implementation form of the second aspect of the invention, the receiving method further comprises the step of receiving a respective pulse power especially for setting to auto-level. Advantageously, for example, inefficiencies can further be reduced.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Exemplary embodiments of the invention are now further explained with respect to the drawings by way of example only, and not for limitation. In the drawings.

DETAILED DESCRIPTION

A receiver with a power detecting function for a pulsed signal and a receiving method with a power detecting function for a pulsed signal, whereby both a high accuracy and a high efficiency are ensured especially in the context of setting up signal analyzers with special respect to pulsed signals, are provided. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

A processor, unit, module or component (as referred to herein) may be composed of software component(s), which are stored in a memory or other computer-readable storage medium, and executed by one or more processors or CPUs of the respective devices. A module or unit may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in computer memory storage.

Firstly, before exemplary embodiments of the invention will be discussed in greater detail, some general and introductive aspects are explained in the following.

The averaged input power or the square root of the averaged input power (RMS) is often one of the first parameter needed to setup an analyzer effectively. Together with the maximum power, also the crest factor of a signal can be calculated.

There exists an optimum power level at the input of the first mixer stage to maximize the measurement dynamic. This power level is controlled by an attenuator at the analyzer's input. Measuring the power is crucial to get the optimum attenuator level.

Analog power meters and standard digital methods fail to separate on-power from off-power for pulsed signals. If the pulse start and the pulse stop are known, triggering the power measurement would be a solution. But setting up the trigger level correctly also requires information about the pulse levels which had to be extracted from an exhaustive offline analysis of a captured data stream.

The presented digital circuit and method determines the maximum averaged on-power of pulsed signals during capture in real time. The only information required is the minimum pulse length, which is known by the signal standard definition, for instance, the minimum frame length of WLAN (wireless local area network) pulses. The minimum pulse length defines the optimum average length of the power detector.

Figure 1:
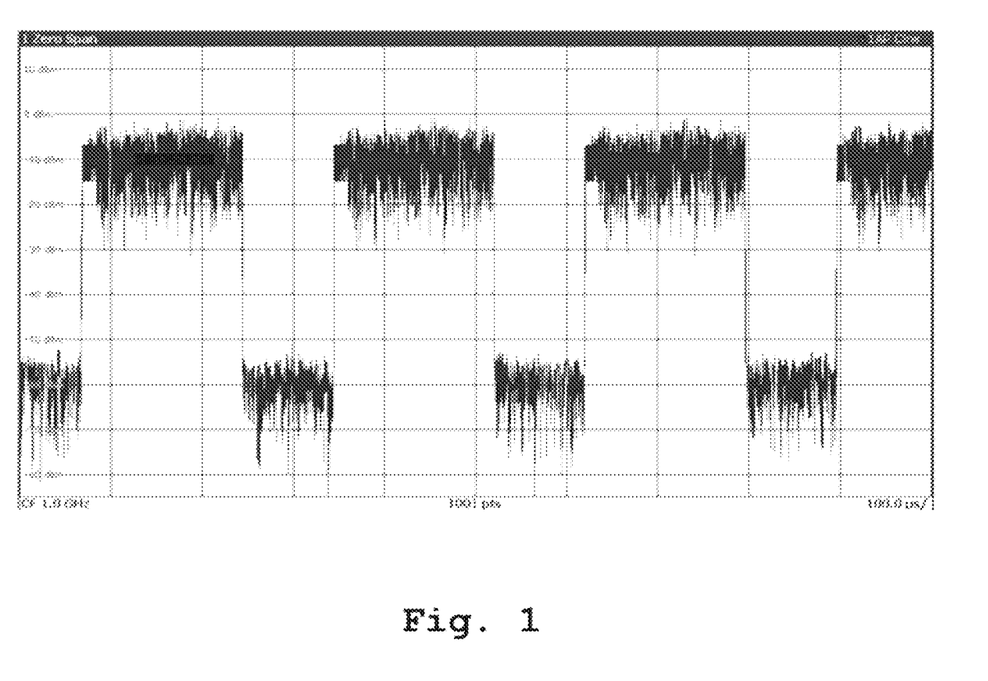
FIG. 1 shows an exemplary diagram of a pulsed WLAN-signal with average on-power of −10 dBm.

In this context, an exemplary diagram of a pulsed WLAN-signal with average on-power of −10 dBm is illustrated by FIG. 1.

Figure 2:
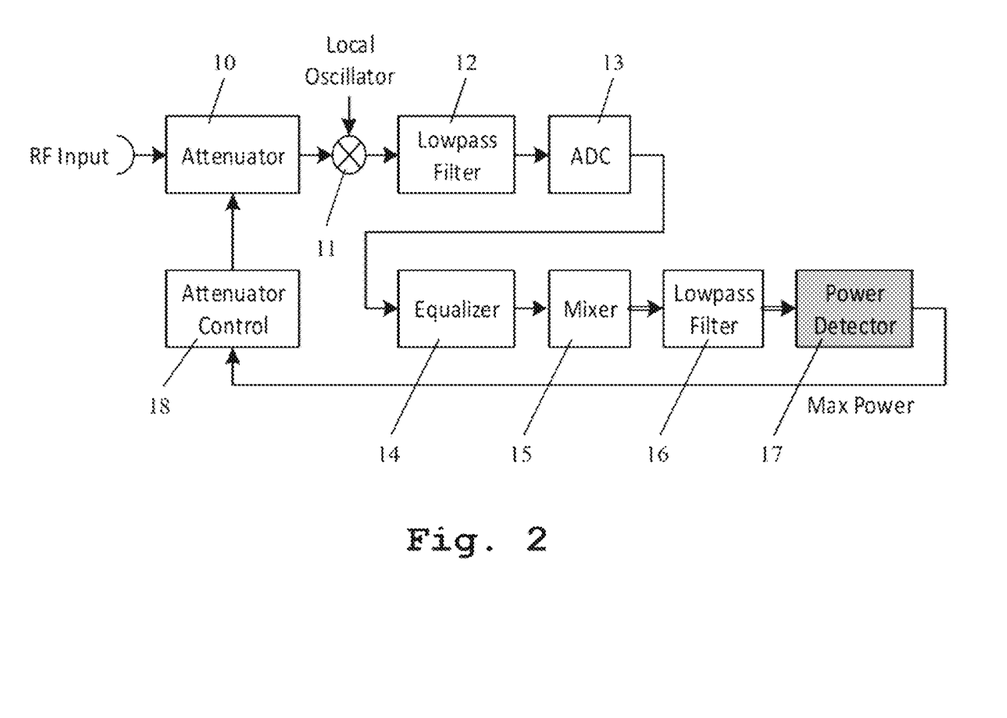
FIG. 2 shows an exemplary embodiment with respect to a typical position of the power detector within the DSP chain.

Furthermore, the above-mentioned power detector may typically work within a signal analyzer as exemplarily shown in FIG. 2. It is noted that FIG. 2 illustrates a typical position of the power detector within the respective DSP (digital signal processor) chain.

In this context, an input of an attenuator 10 receives a RF (radio frequency) input. An output of said attenuator is connected to an input of a mixer 11. Additionally, a local oscillator is connected to a further input of said mixer 11. An output of said mixer 11 is connected to an input of a lowpass filter 12. An output of said lowpass filter 12 is connected to an input of an analog-to-digital converter (ADC) 13. An output of said analog-to-digital converter 13 is connected to an input of an equalizer 14. An output of said equalizer 14 is connected to an input of a further mixer 15, wherein an output of said further mixer 15 is connected to an input of a further lowpass filter 16. An output of said further lowpass filter 16 is connected to an input of a power detector 17, wherein an output of said power detector 17 is connected to an input of an attenuator control 18. In this context, an output of said attenuator control 18 is connected to an input of the above-mentioned attenuator 10.

The programmable attenuator 10, 18 decreases the power of the RF input to operate the mixer at an optimum level. The mixer 11 moves the signal down to a low intermediate frequency (IF), which can be sampled by the analog-to-digital converter 13 preceded by the anti-aliasing lowpass filter 12.

The equalizer 14 compensates for linear distortions of the instrument, which occur mainly behind the input attenuator 10. The power detector 17 itself works preferable on a complex baseband signal. The digital mixer 15 shifts the IF signal to the complex baseband and the lowpass filter 16 removes the unused sideband. The maximum power as result of the power detector 17 preferably determines the optimum attenuator level.

FIG. 2 shows only one exemplary implementation of a signal analyzer. The analyzer could mix directly to the complex baseband using two mixers with 90° delay and two ADCs in parallel. In addition, several mixer stages could be involved in an analyzer. The power detector 17 could work on the digital IF signal behind the equalizer 14 instead on the complex baseband signal.

It is further noted that the presented implementations of the power detector especially determine the average power within a time window that steps or slides over the power signal. To measure the correct on-power of pulsed signals, at least one window must completely lie within a pulse. The maximum of all measured average power values is the power-on result especially used for auto-leveling.

Figure 3:
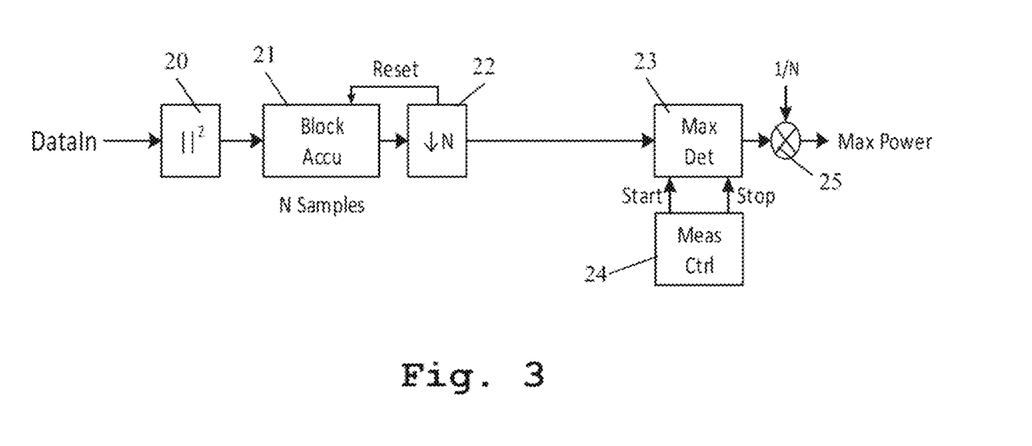
FIG. 3 shows an exemplary embodiment of a step-window power detector in accordance with the first aspect of the invention.

Now, with respect to FIG. 3, an exemplary embodiment of a step-window power detector in accordance with the first aspect of the invention is shown.

The data input magnitude is squared especially by squaring unit 20, which represents the instantaneous power. The block accumulator 21 outputs the sum of N consecutive power samples 22. The accumulator resets after each block and outputs one sum result every N samples. A maximum detector 23 determines the maximum power sum during a time period, which is defined by a superseded measurement control 24.

The maximum sum is normalized by the window length N especially with the aid of the multiplier 25. Alternatively, the normalization can be situated before the maximum detector.

Figure 4:
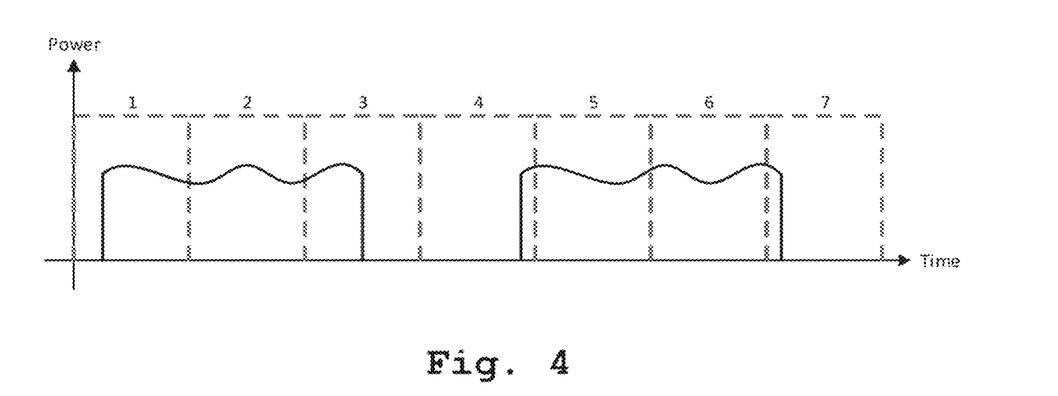
FIG. 4 shows an exemplary time diagram of the step-window power detector.

FIG. 4 shows a time diagram of the step-window power detector. If the window length N is below half of the minimum pulse width, at least one window lies fully within each pulse.

Figure 5:
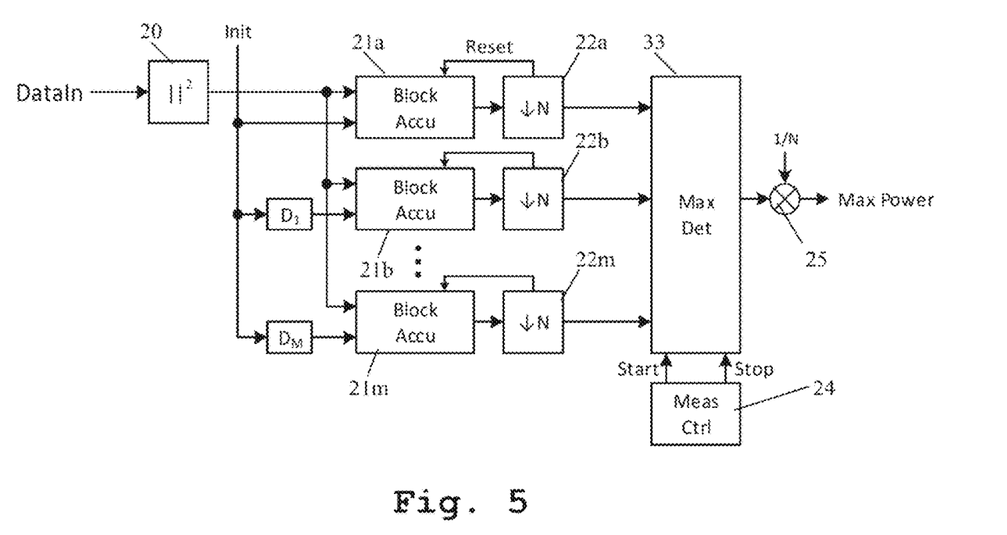
FIG. 5 shows an exemplary embodiment of a multiple-step-window power detector in accordance with the first aspect of the invention.

Moreover, FIG. 5 shows an exemplary embodiment of a multiple-step-window power detector in accordance with the inventive receiver.

The step-window power detector exemplarily according to FIG. 3 is a quite simple implementation, but limits the window length to half the minimum pulse width. To overcome these restrictions, several accumulators and down-samplers can run in parallel with different initial processing delays as shown in FIG. 5. This implementation introduces an overlap of the accumulator windows at the cost of additional parallel hardware.

Figure 6:
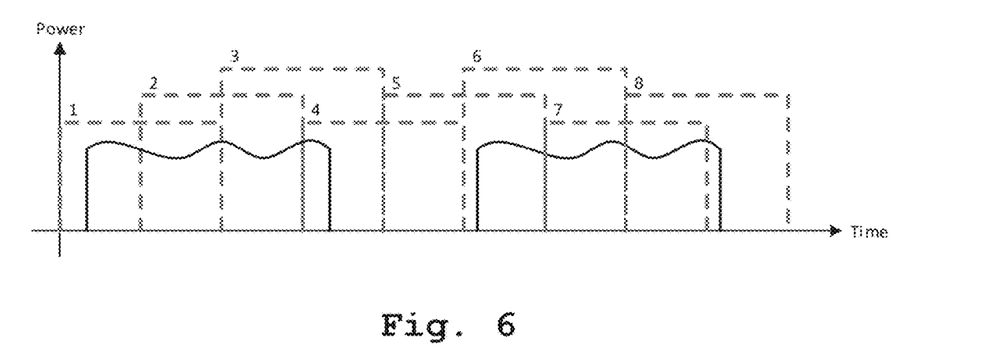
FIG. 6 shows an exemplary time diagram of the multiple-step-window power detector.

FIG. 6 shows the time diagram for a two times parallel implementation of the block accumulator. The maximum window size N increases to ⅔ of the minimum pulse width.

Figure 7:
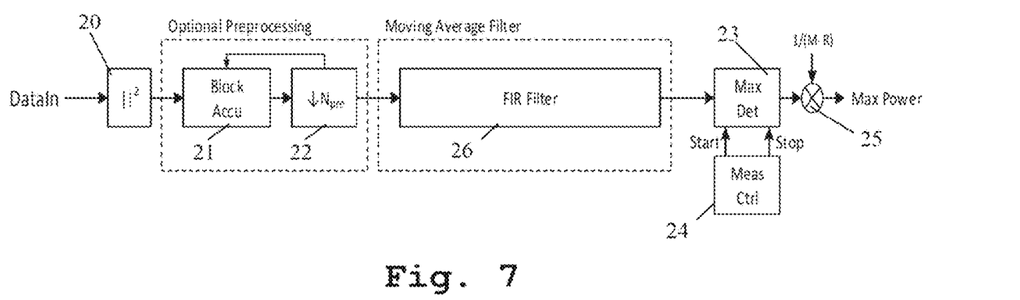
FIG. 7 shows an exemplary embodiment of a moving-average power detector in accordance with the first aspect of the invention.

Instead of multiplication of the block accumulator, a true moving-average power detector as shown in FIG. 7 may especially be the optimum solution. It allows window lengths up to the minimum pulse width.

A moving-average FIR (finite impulse response) filter 26 for a window length of N samples has an impulse response of N samples. This makes a direct realization in hardware impossible for reasonable window lengths. An optional pre-processing with a block accumulator 21 and a down-sampler 22 can lower the requirements of the FIR filter 26, but introduces again a stepping of the window.

Figure 8:
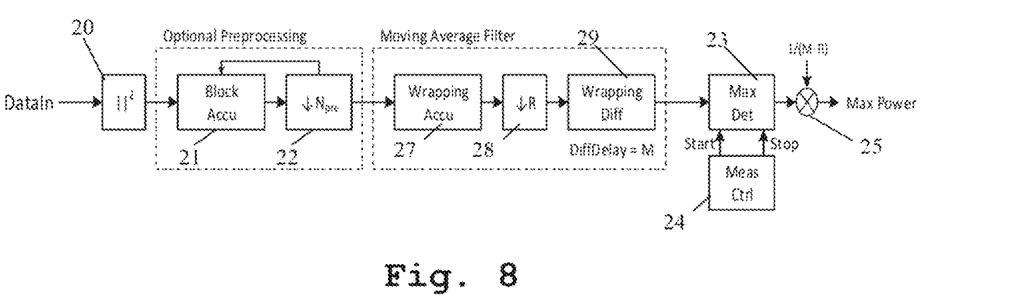
FIG. 8 shows an exemplary embodiment of a sliding-window power detector in accordance with the first aspect of the invention.

However, a more sophisticated implementation of the FIR filter as shown in FIG. 8 avoids the limitations of a direct realization.

The sliding-window power detector implements a moving-average filter with a window length N=R·M. The optional block accumulator 21 can be used to lower the sample rate for the subsequent processing steps, e.g. to reduce a parallel data stream (super-sampling) to a non-parallel data stream. The wrapping accumulator 27 consecutively accumulates the incoming samples:

$$y_{accu}(k) = x_{in}(k) + x_{in}(k-1).$$

Wrapping of the digital number format is explicitly allowed if the accumulator register can store at least the sum of N maximum input samples. Thus, the input word width must be increased by $\log_2(N)$ bits. The output of the accumulator is decimated by R especially by the decimator 28. The wrapping differentiator 29 subtracts the decimated samples with a delay of M:

$$y_{diff}(k) = x_{dec}(k) - x_{dec}(k-M).$$

The differential delay M of the differentiator 29 needs memory resources and should be reasonable limited to a value $M_{max}$, for instance, to one block RAM (random access memory) size of a respective FPGA (free-programmable gate array). To realize a window length N, two cases can be distinguished:

a) $N \leq M_{max}$;
   R=1, M=N;
This especially is a sample-by-sample moving-average filter.

b) $N > M_{max}$;
   Here, it is to find a trade-off between R and M. M should be as high as possible, but the realizable window lengths are multiples of M, since R especially is an integer.

Figure 9:
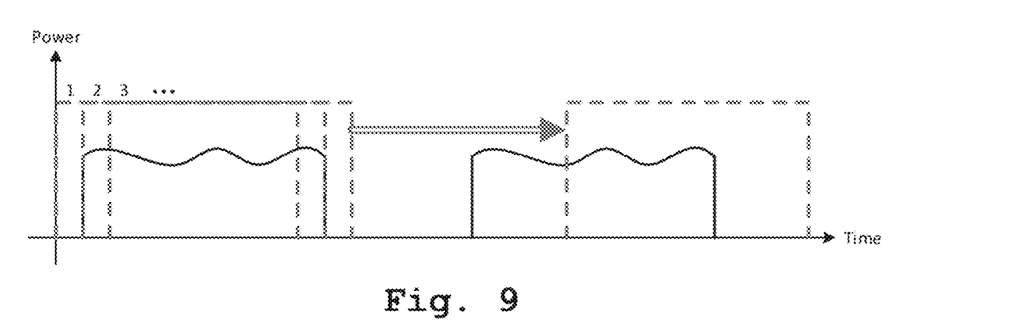
FIG. 9 shows an exemplary time diagram of the sliding-window power detector.

In case b), the filter is not a sample-by-sample moving-average filter, but for reasonable high memory length M, the step size is much shorter than the window length. The window can always be chosen nearly as long as the minimum pulse width. In this context, FIG. 9 shows an exemplary time diagram of the sliding-window power detector.

Figure 10:
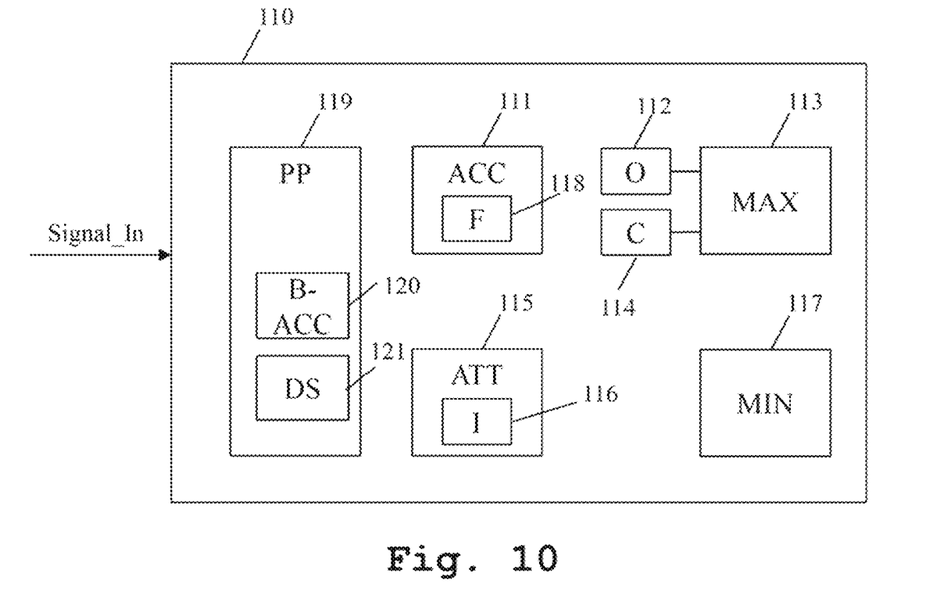
FIG. 10 shows a block diagram of an exemplary embodiment of the first aspect of the invention.

Furthermore, FIG. 10 illustrates an exemplary embodiment of the inventive receiver 110 with a power detecting function for a pulsed signal. Said receiver comprises an accumulator for accumulating samples of the respective power of the corresponding signal over time. In this context, the respective accumulation length is a window being based on the pulse length of the corresponding signal.

In addition to this, the receiver 110 further comprises an output 112 for outputting several windows and a maximum detector 113, wherein the maximum detector 113 determines a maximum power value of the several windows. It is noted that it might be particularly advantageous if the maximum power value over the several windows comprises or is the respective detected power of the corresponding pulse when it is in on-state.

In accordance with FIG. 10, the receiver 110 further comprises a control 114, wherein the control 114 is configured to instruct the maximum detector 113 when to start or reset. Furthermore, the receiver 110 comprises an attenuator 115 comprising an input 116, wherein the input 116 receives a respective pulse power especially for setting to auto-level. Moreover, the receiver 110 further comprises a minimum power detector 117, wherein the minimum power detector 117 provides the respective level of the corresponding signal when it is in off-state.

It is noted that it might be particularly advantageous if the receiver 110 or the minimum power detector 117 uses the respective level and/or corresponding powers as an input in order to provide a trigger level. Advantageously, the minimum power detector 117 may preferably comprise a variable window length. As a further advantage, the minimum power detector 117 may further provide a respective noise level of the corresponding signal.

As it can further be seen from FIG. 10, the accumulator 111 comprises a filter 118. In this context, it is noted that an output of the filter may preferably comprise or be a sliding window provided to the maximum detector 113. With respect to the filter 118, it is noted that said filter may preferably comprise or be a finite impulse response filter or an infinite impulse response filter. In addition to this or as an alternative, the filter 118 may especially comprise or be an accumulator followed by a decimator followed by a differentiator.

According to FIG. 10, the receiver 110 further comprises a pre-processor 119 for pre-processing especially the pulsed signal. In this context, the pre-processor 119 exemplarily comprises a block accumulator 120 and a down-sampler 121 to reduce a respective sampling rate.

Figure 11:
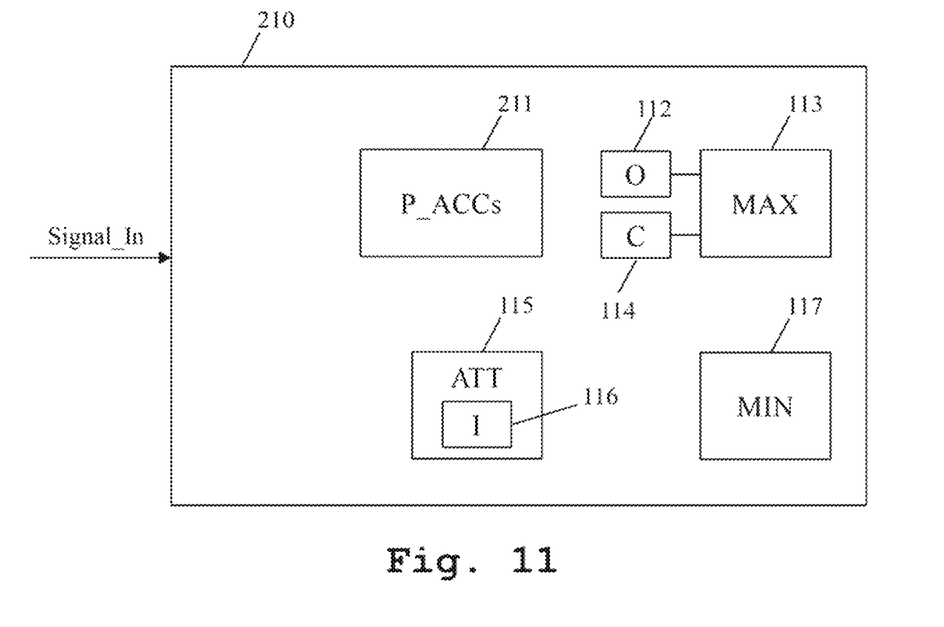
FIG. 11 shows a block diagram of a further exemplary embodiment of the first aspect of the invention.

Moreover, FIG. 11 illustrates a further exemplary embodiment of the inventive receiver 210 with a power detecting function for a pulsed signal.

In this context, the receiver 210 comprises several parallel accumulators 211 with different time delay, wherein the maximum detector 113 is configured to receive respective overlapping results from the corresponding time delay especially for determining the respective power of the corresponding on-signal.

Figure 12:
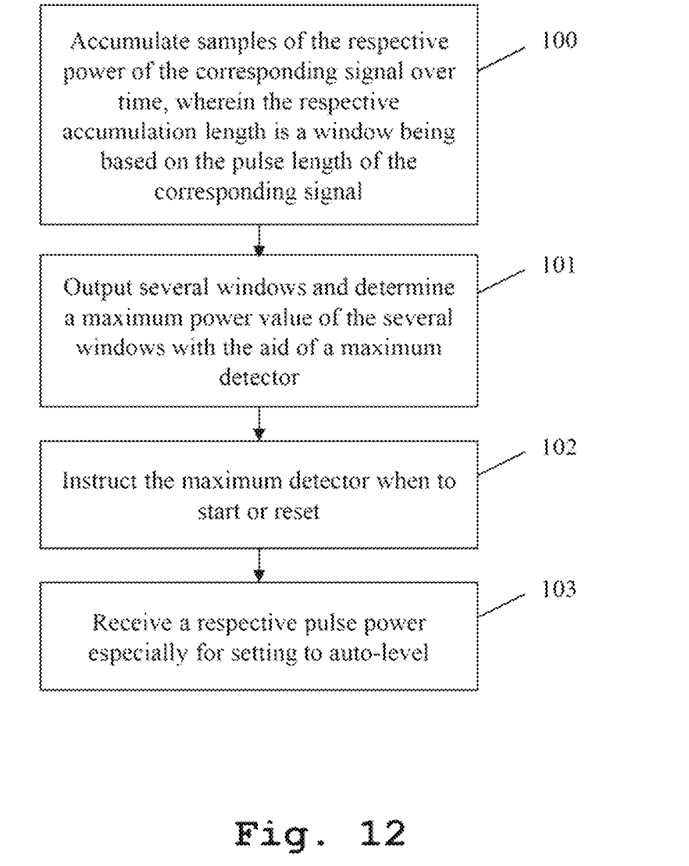
FIG. 12 shows a flow chart of an exemplary embodiment of the second aspect of the invention.

Finally, FIG. 12 shows a flow chart of an exemplary embodiment of the inventive receiving method with a power detecting function for a pulsed signal. In a first step 100, samples of the respective power of the corresponding signal are accumulated over time. In this context, the respective accumulation length is a window being based on the pulse length of the corresponding signal.

Then, in a second step 101, several windows are outputted and a maximum power value of the several windows is determined with the aid of a maximum detector. In this context, it might be particularly advantageous if the maximum power value over the several windows comprises or is the respective detected power of the corresponding pulse when it is in on-state.

Furthermore, in a third step 102, the maximum detector is instructed when to start or reset. Moreover, in a fourth step 103, a respective pulse power is received especially for setting to auto-level.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A receiver with a power detecting function for a pulsed signal, the receiver comprising:
    an accumulator configured to accumulate samples of power values of the pulsed signal over a period of time;
    an output configured to output a plurality of the accumulated sample power values, wherein the plurality of accumulated sample power values is accumulated over a respective window within the period of time; and
    a maximum detector configured to determine a maximum power value of the plurality of accumulated sample power values; and
    wherein the window is based on a pulse length of the pulsed signal, and
    wherein the determined maximum power value comprises a respective detected power of a corresponding pulse when it is in an on-state.

2. The receiver according to claim 1, wherein the receiver further comprises:
    a control, wherein the control is configured to instruct the maximum detector when to start or reset.

3. The receiver according to claim 1, wherein the receiver further comprises:
    an attenuator comprising an input, wherein the input is configured to receive a respective pulse power for setting to auto-level.

4. The receiver according to claim 1, wherein the receiver further comprises:
    a minimum power detector, wherein the minimum power detector is configured to provide a respective level of a corresponding pulse when it is in off-state.

5. The receiver according to claim 4, wherein the receiver or the minimum power detector is configured to use the respective level and/or corresponding powers as an input in order to provide a trigger level.

6. The receiver according to claim 4, wherein the minimum power detector comprises a variable window length.

7. The receiver according to claim 4, wherein the minimum power detector is further configured to provide a respective noise level of the corresponding pulse.

8. The receiver according to claim 1, wherein the receiver further comprises:
    several parallel accumulators with different time delay; and
    wherein the maximum detector is configured to receive respective overlapping results from a corresponding time delay for determining the respective detected power of the corresponding pulse when it is in the on-state.

9. The receiver according to claim 1, wherein the accumulator comprises a filter, and wherein an output of the filter comprises a sliding window provided to the maximum detector.

10. The receiver according to claim 9, wherein the filter comprises a finite impulse response filter or an infinite impulse response filter.

11. The receiver according to claim 9, wherein the filter comprises an accumulator followed by a decimator followed by a differentiator.

12. The receiver according to claim 1, wherein the receiver further comprises:
    a pre-processor, wherein the pre-processor is configured to pre-process the pulsed signal.

13. The receiver according to claim 12, wherein the pre-processor comprises a block accumulator and/or a down-sampler to reduce a respective sampling rate.

14. A receiving method with a power detecting function for a pulsed signal, the receiving method comprising the step of:
    accumulating samples of power values of the pulsed signal over a period of time, and outputting a plurality of the accumulated sample power values, wherein each of the plurality of accumulated sample power values is accumulated over a respective window within the period of time; and
    determining a maximum power value of the plurality of accumulated sample power values; and
    wherein the window is based on a pulse length of the pulsed signal, and
    wherein the determined maximum power value comprises a respective detected power of a corresponding pulse when it is in an on-state.

15. The receiving method according to claim 14, wherein the receiving method further comprises the step of:
    instructing the maximum detector when to start or reset.

16. The receiving method according to claim 14, wherein the receiving method further comprises the step of:
    receiving a respective pulse power for setting to auto-level.

* * * * *